(12) United States Patent
Portmann et al.

(10) Patent No.: US 7,358,812 B2
(45) Date of Patent: Apr. 15, 2008

(54) CLASS AB OPERATIONAL BUFFER

(75) Inventors: Lionel Portmann, Lausanne (CH); Yi-Chan Chen, Madou Township, Tainan County (TW)

(73) Assignee: Elan Microelectronics Corporation, Hsinchu (TW)

( * ) Notice: Subject to any disclaimer, the term of this patent is extended or adjusted under 35 U.S.C. 154(b) by 162 days.

(21) Appl. No.: 11/318,876

(22) Filed: Dec. 28, 2005

(65) Prior Publication Data

US 2006/0170498 A1    Aug. 3, 2006

(30) Foreign Application Priority Data

Dec. 31, 2004   (TW) .............................. 93141723 A

(51) Int. Cl.
*H03F 3/45* (2006.01)
(52) U.S. Cl. ...................... 330/255; 330/257
(58) Field of Classification Search ................ 330/253, 330/255, 257
See application file for complete search history.

(56) References Cited

U.S. PATENT DOCUMENTS 6,356,153 B1 *   3/2002   Ivanov et al. ................ 330/255
6,781,462 B2 *   8/2004   Hwang et al. ............... 330/255

* cited by examiner

*Primary Examiner*—Khanh Van Nguyen
(74) *Attorney, Agent, or Firm*—Rosenberg, Klein & Lee

(57) ABSTRACT

A class AB operational buffer comprises an output stage, a voltage supply circuit to provide a first voltage and a second voltage to drive the output stage, a first current source to provide a first current, a second current source to provide a second current, a first current mirror having a first reference branch coupled with the first current and a first mirror branch coupled with the second current through the voltage supply circuit, and a second current mirror having a second reference branch coupled between the second current source and first mirror branch and a second mirror branch coupled between the first current source and first reference branch.

11 Claims, 5 Drawing Sheets

CLASS AB OPERATIONAL BUFFER

FIELD OF THE INVENTION

The present invention is related generally to an operational buffer and, more particularly, to a class AB operational buffer having high stability, low power consumption and simple bias circuit.

BACKGROUND OF THE INVENTION

The operational buffer in the source driver for thin film transistor liquid crystal display (TFT LCD) is required to have:

(1) high slew rate such that the driving capability is strong enough to precharge the resistor-capacitor (RC) load of the LCD panel to a predetermined voltage level in a predetermined time period;

(2) low quiescent current to save power as much as possible under the condition of being able to drive the RC load of the LCD panel;

(3) low offset voltage for supplying precise driving voltage on the LCD panel for better display performance; and (4) excellent stability when the above requirements are all satisfied since the operational buffer is always configured with negative feedback.

However, as shown in FIG. 1, in a conventional class AB operational buffer 100, to reduce the offset resulted from the differential input pair 102, there must be introduced with cascade transistors M5 and M6 to increase the direct current (DC) gain of the first stage circuit 101, which will also require larger Miller capacitor 104 to improve the stability of the operational buffer 100. Also due to the insertion of the cascade transistors M5 and M6, the path for current mirroring from the node 106 to the node outp is lengthened, thereby resulting in mismatched mirroring thereof, and the stability is degraded. Moreover, in the operational buffer 100, even though the nodes 110 and outn could be biased at a same voltage, the quiescent current of the output stage 103 will be proportional to the current of the first stage circuit 101 accordingly and therefore, higher stability and less power consumption can never be achieved at same time, resulting in poor design flexibility. In addition, the parasitic capacitance seen from the currents flowing into the nodes 106 and 108 are so large that the phase thereof are significantly shifted, and the stability is decreased accordingly. Furthermore, the operational buffer 100 needs three bias voltages V1, V2 and V3, and the bias circuit therefore (not shown in the figure) will be thus more complicated.

Therefore, it is desired a better class AB operational buffer to avoid the above disadvantages.

SUMMARY OF THE INVENTION

An object of the present invention is to provide a novel configuration for a class AB operational buffer.

Another object of the present invention is to provide a more stable class AB operational buffer.

Yet another object of the present invention is to provide a class AB operational buffer having high stability and low power consumption at same time.

Still another object of the present invention is to provide a class AB operational buffer requiring simpler bias circuit.

According to the present invention, a class AB operational buffer comprises an output stage, a voltage supply circuit to provide a first voltage and a second voltage to drive the output stage, a first current source to provide a first current, a second current source to provide a second current in order to adjust the first voltage, a first current mirror having a first reference branch coupled with the first current and a first mirror branch coupled with the second current through the voltage supply circuit to mirror the first current to adjust the second voltage, and a second current mirror having a second branch coupled between the second current source and first mirror branch and a second mirror branch coupled between the first current source and first reference branch. The voltage supply circuit includes a PMOS transistor and an NMOS transistor coupled in parallel to be controlled by a first bias voltage and a second bias voltage, respectively.

Since there is no cascade transistor in the class AB operational buffer of the present invention, the class AB operational buffer will have higher stability and require fewer bias voltages. Further, when the first and second bias voltages have error, the first and second currents will not be influenced, and thereby preventing the output current varying with the error of the first and second bias voltages. As a result, high stability and low power consumption are obtained at same time.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
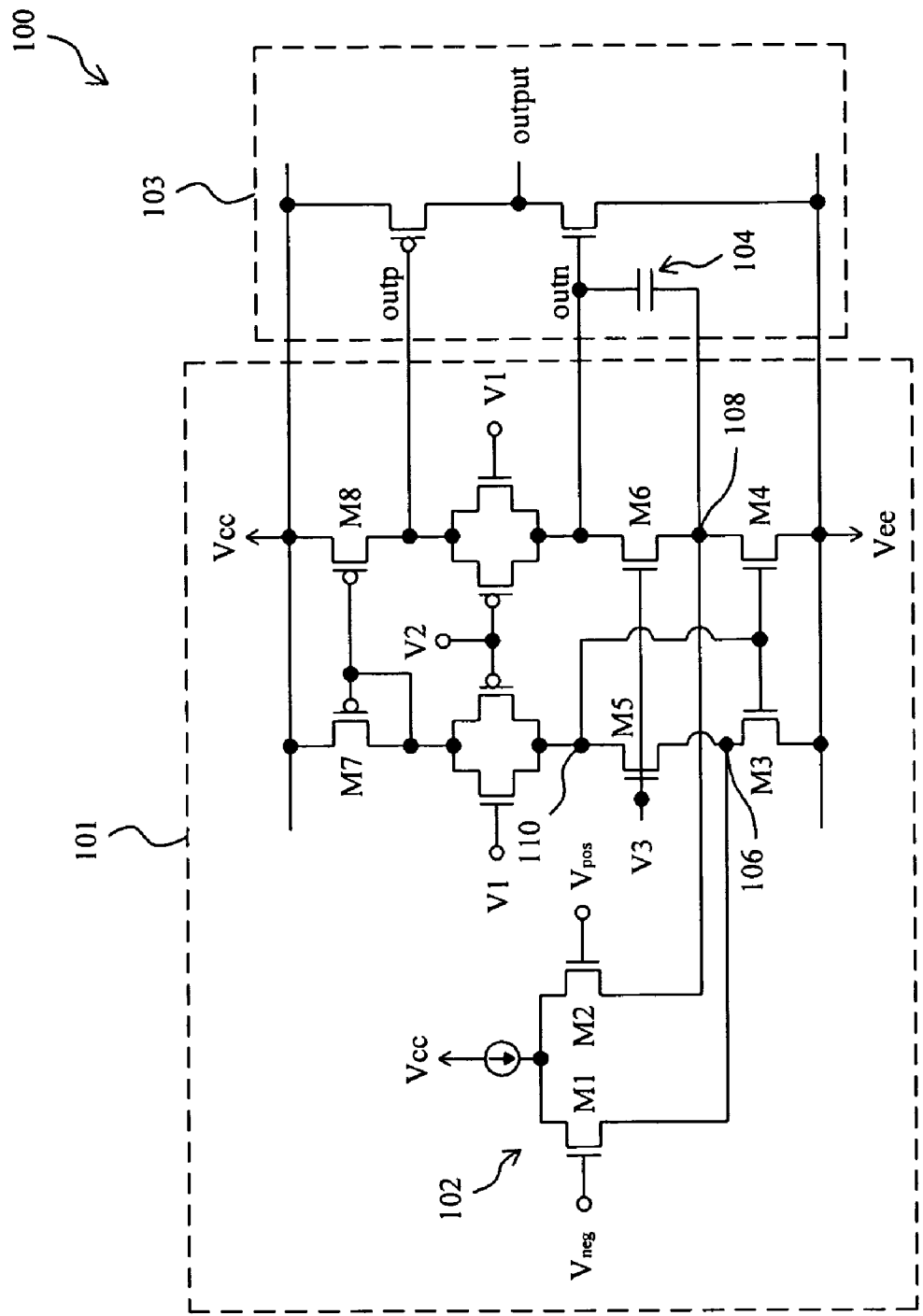
FIG. 1 is a circuit diagram of a class AB operational buffer.
Figure 2:
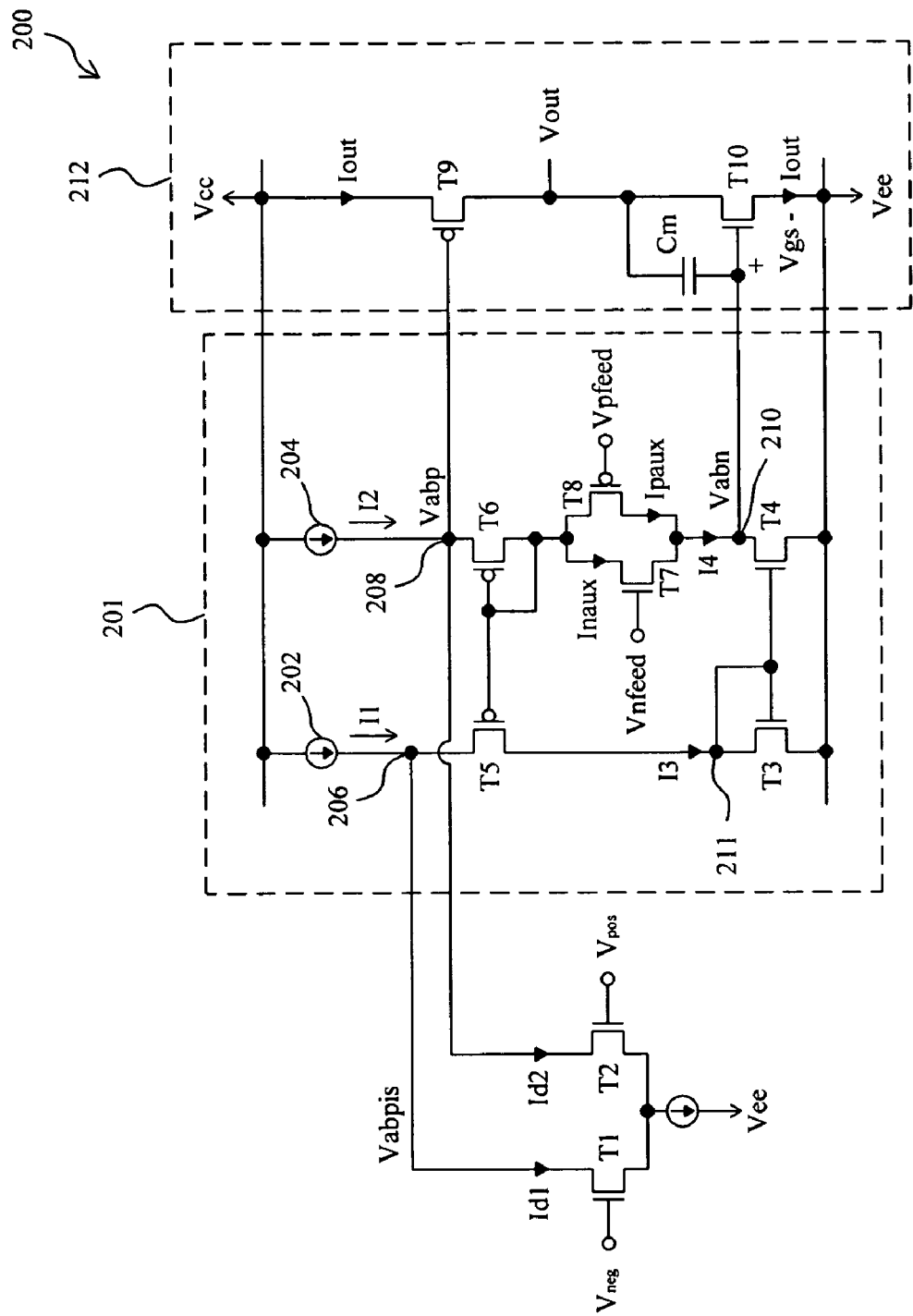
FIG. 2 is a circuit diagram of an NMOS input class AB operational buffer according to the present invention.

FIG. 2 is a circuit diagram of a class AB operational buffer 200, which comprises a differential input pair including NMOS transistors T1 and T2 to produce currents Id1 and Id2 in response to input voltages Vneg and Vpos, respectively, and driving circuit 201 to drive output stage 212 in response to the currents Id1 and Id2 to thereby produce output voltage Vout and output current Iout. In the driving circuit 201, current sources 202 and 204 provide currents I1 and I2 respectively, the currents I1 and I2 are drained therefrom with the currents Id1 and Id2 such that currents I3 and I4 are left, transistors T7 and T8 constitute a voltage supply circuit to provide voltages Vabp and Vabn to the nodes 208 and 210 to drive the output stage 212, transistors T3 and T4 constitute a current mirror for the currents I3 and I4 to be equal to one other, and transistors T5 and T6 constitute a current mirror such that the voltage Vabpis on the node 206 is tracking to the voltage Vabp on the node 208. Since the operational buffer 200 does not require any cascade configuration to increase the DC gain as in the conventional one 100, the capacitor Cm is not required to be so large to reduce the offset resulted from the differential input pair of the NMOS transistors T1 and T2. In addition, the current sources 202 and 204 only see the capacitances on the drains of the corresponding transistors, without the capacitances from the gates to the sources of the corresponding transistors as in the conventional one 100, and therefore, the phase shifts of the currents will be less and better stability is obtained accordingly. Further, there is only one transistor T4 between the gate of the transistor T10 and the supply voltage Vee, unlike two transistors M4 and M6 in the conventional operational buffer 100, and as a result, the gate-source voltage difference Vgs of the transistor T10 will be biased very close to the threshold voltage Vth, and the working voltages on the nodes 210 and 211 will be very close to Vgs accordingly, thereby reducing the offset resulted from the transistors T3 and T4 to an insignificant level. In the operational buffer 200, when the bias voltages Vnfeed and Vpfeed have error, they will not influence the currents on the two prior branches of the transistors T5 and T6, thereby preventing the output current Iout from varying with the error of the bias voltages Vnfeed and Vpfeed, and thus high stability and low power consumption are obtained at same time. In the path for current mirroring from the node 206 to the node 208, there are fewer transistors than in the conventional operational buffer 100, the mismatch resulted from the current mirroring will be much less than the conventional one 100 and the stability of the class AB operational buffer 200 will be thus better. In the operational buffer 200, furthermore, there requires only two bias voltages Vnfeed and Vpfeed, and the bias circuit therefor (not shown hereof will be simpler than for the conventional operational buffer 100.

Figure 3:
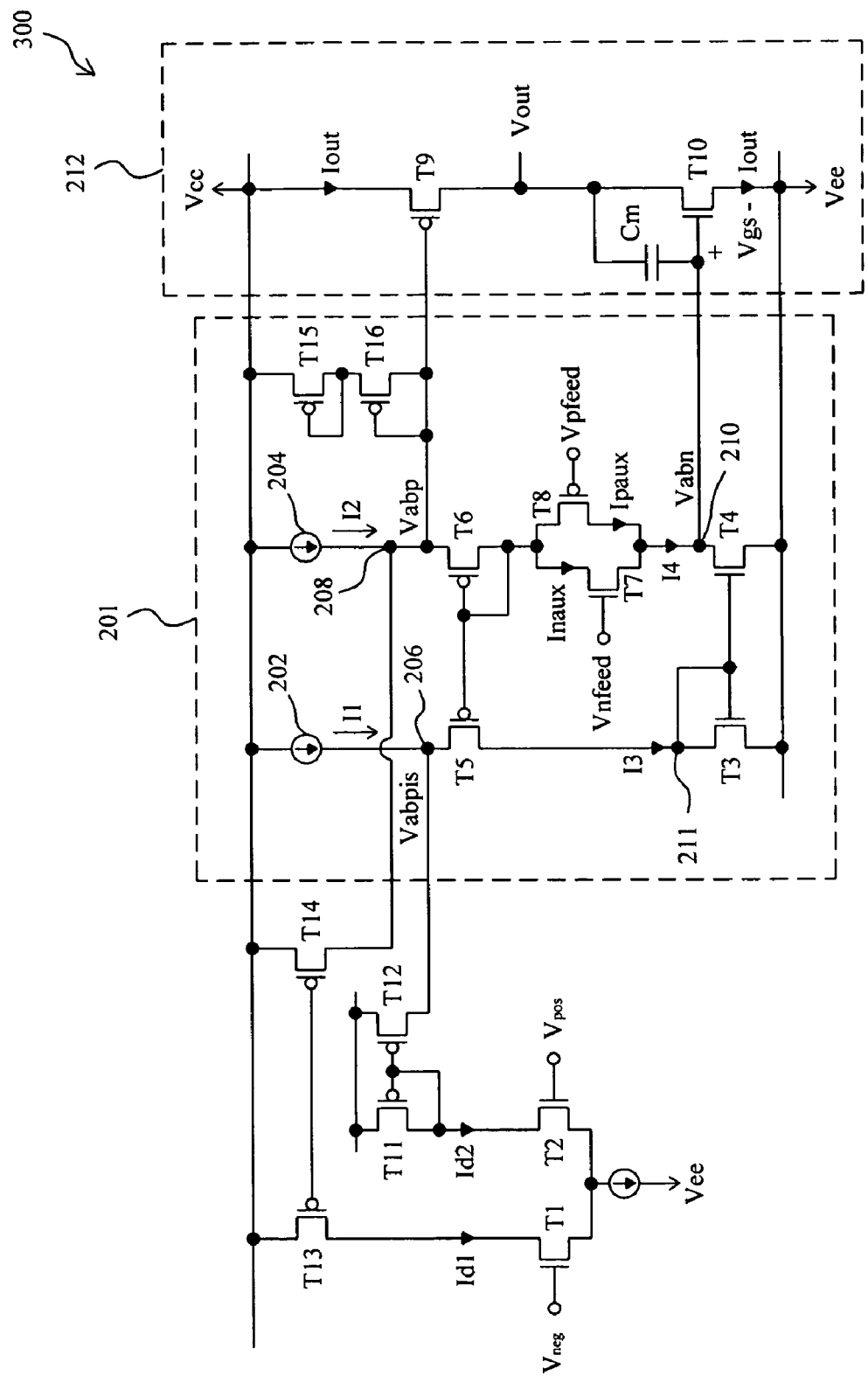
FIG. 3 is a circuit diagram of another NMOS input class AB operational buffer according to the present invention.

FIG. 3 is a circuit diagram of another class AB operational buffer 300 having a structure similar to that of the circuit 200 shown in FIG. 2. However, to prevent the supply voltages Vcc and Vee from abnormal drops to result in the negative feedback of being disabled to further lock the output voltage Vout, the operational buffer 300 is introduced with transistors T11 and T12 constituting a current mirror to mirror the current Id2 flowing through the transistor T2 to the node 206, and transistors T13 and T14 constituting a current mirror to mirror the current Id1 flowing through the transistor T1 to the node 208. In addition, it is known that the swing of the voltage Vabp on the node 208 will influence the maximum level of the output current Iout and overshoot. To clamp the swing of the voltage Vabp for better performance, there is introduced with transistors T15 and T16 to constitute clamping diodes between the supply voltage Vcc and the node 208.

Figure 4:
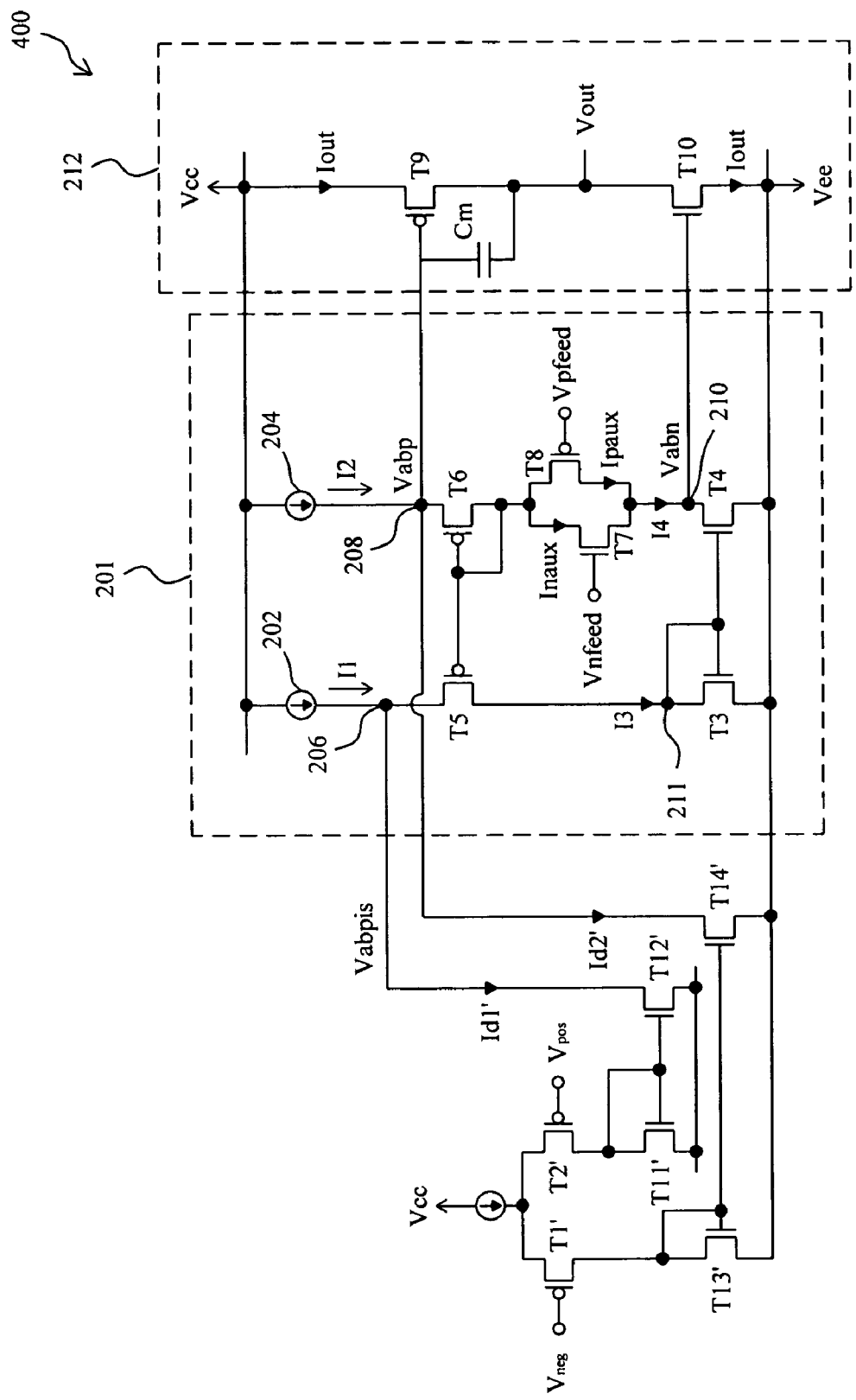
FIG. 4 is a circuit diagram of a PMOS input class AB operational buffer according to the present invention.

The above operational buffers 200 and 300 both are NMOS input operational buffers, i.e., the differential input pair is constructed by NMOS transistors, and such operational buffer is used in the source driver of a TFT LCD for driving positive voltage. For driving negative voltage, a PMOS input operational buffer 400 is provided in FIG. 4. Conventionally, to transform the NMOS input operational buffer 300 of FIG. 3 to a PMOS input operational buffer, in addition to replace the NMOS transistors T1 and T2 in the differential input pair with PMOS transistors, the transistors T3 and T4 also have to be replaced with PMOS transistors. However, such replacement will slow the speed since the DC gain will be increased. To avoid this drawback, the PMOS input operational buffer 400 still employ the NMOS transistors T3 &T4, and is only replaced the NMOS transistors T1 and T2 in the differential input pair with PMOS transistors T1' and T2' for better stability.

Figure 5:
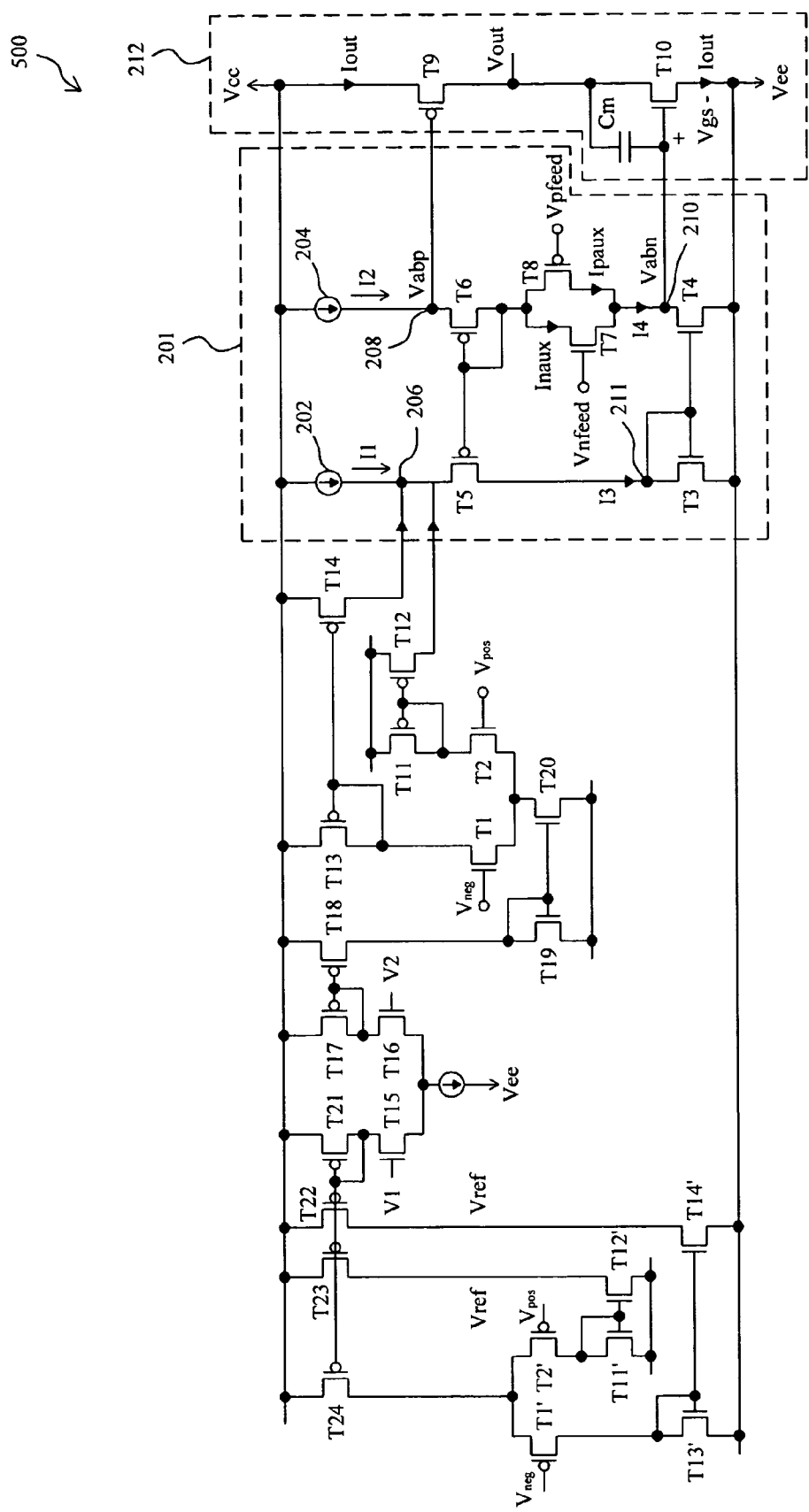
FIG. 5 is a circuit diagram of a rail-to-rail class AB operational buffer according to the present invention.

FIG. 5 is a circuit diagram of a rail-to-rail operational buffer 500, in which the differential input pair constructed by the NMOS transistors T1 and T2 and the differential input pair constructed by the PMOS transistors T1'&T2' use a common driving circuit 201 to drive the output stage 212, and the driving circuit 201 also includes the current sources 202 and 204 and the transistors T3-T8 as in the above embodiments. The current flowing through the transistor T1 is mirrored by the current mirror constructed by the transistors T13 and T14 to the driving circuit 201, the current flowing through the transistor T2 is mirrored by the current mirror constructed by the transistors T11 and T12 to the driving circuit 201, the current flowing through the transistor T1' is mirrored by the current mirror constructed by the transistors T13' and T14' to the driving circuit 201, and the current flowing through the transistor T2' is mirrored by the current mirror constructed by the transistors T11' and T12' to the driving circuit 201. Additionally, the transistors T15, T16, T21, T22 and T23 constitute a reference voltage generator to produce a reference voltage Vref close to ½ Vcc to compare with the input voltages Vneg and Vpos.

The rail-to-rail operational buffer 500 is equivalent to a combination of the NMOS input operational buffer 300 and the PMOS input operational buffer 400, which has the advantages that the operational buffers 300 and 400 have, could save much more power due to the comparison of the input voltages Vneg and Vpos with the reference voltage Vref close to ½ Vcc, and suffers less linearity.

In a conventional rail-to-rail operational buffer, two driving circuits are provided for the differential input pair constructed by NMOS transistors and the differential input pair constructed by PMOS transistors, respectively; while the rail-to-rail operational buffer 500 uses a common driving circuit 201, and thus has simpler circuit since it saves a driving circuit.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as string forth in the appended claims.

What is claimed is:

1. A class AB operational buffer comprising:
   an output stage;
   a voltage supply circuit for providing a first voltage and a second voltage to drive the output stage;
   a first current source for providing a first current;
   a second current source for providing a second current;
   a first current mirror having a first reference branch coupled with the first current and a first mirror branch coupled with the second current through the voltage supply circuit for mirroring the first current to adjust the second voltage; and
   a second current mirror having a second reference branch coupled between the second current source and first mirror branch and a second mirror branch coupled between the first current source and first reference branch to adjust the first voltage.

2. The operational buffer of claim 1, further comprising a differential input pair for producing a third current and a fourth current in response to a first input voltage and a second input voltage to drain from the first and second currents.

3. The operational buffer of claim 2, further comprising:
   a third current mirror for mirroring the third current to drain from the first current; and
   a fourth current mirror for mirroring the fourth current to drain from the second current.

4. The operational buffer of claim 2, wherein the differential input pair comprises a pair of NMOS transistors.

5. The operational buffer of claim 2, wherein the differential input pair comprises a pair of PMOS transistors.

6. The operational buffer of claim 5, wherein the first current mirror comprises two NMOS transistors.

7. The operational buffer of claim 1, wherein the output stage comprises:
- a first transistor coupled between a first supply voltage and an output for being controlled by the first voltage; and
- a second transistor coupled between the output and a second supply voltage for being controlled by the second voltage.

8. The operational buffer of claim 7, further comprising one or more clamping diodes coupled between the first supply voltage and a gate of the first transistor.

9. The operational buffer of claim 1, further comprising:
- a first differential input pair including two NMOS transistors for producing a third current and a fourth current in response to a first input voltage and a second input voltage; and
- a second differential input pair including two PMOS transistors for producing a fifth current and a sixth current in response to a third input voltage and a fourth input voltage;
- wherein the first current is drained by the first differential input pair, and the second current is drained by the second differential input pair.

10. The operational buffer of claim 9, further comprising:
- a third current mirror for mirroring the third current to drain from the first current;
- a fourth current mirror for mirroring the fourth current to drain from the second current;
- a fifth current mirror for mirroring the fifth current to drain from the first current; and
- a sixth current mirror for mirroring the sixth current to drain from the second current.

11. The operational buffer of claim 9, further comprising a voltage generator for providing a reference voltage for the first and second differential input pairs.

* * * * *